(12) United States Patent
Xu et al.

(10) Patent No.: US 7,833,808 B2
(45) Date of Patent: Nov. 16, 2010

(54) METHODS FOR FORMING MULTIPLE-LAYER ELECTRODE STRUCTURES FOR SILICON PHOTOVOLTAIC CELLS

(75) Inventors: Baomin Xu, San Jose, CA (US); Karl A. Littau, Palo Alto, CA (US); David K. Fork, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 255 days.

(21) Appl. No.: 12/054,034

(22) Filed: Mar. 24, 2008

(65) Prior Publication Data

US 2009/0239331 A1    Sep. 24, 2009

(51) Int. Cl.
*H01L 21/00* (2006.01)
*H01L 31/00* (2006.01)

(52) U.S. Cl. ............... 438/19; 257/E27.125; 136/256
(58) Field of Classification Search ............ 438/19; 136/256; 257/E27.125
See application file for complete search history.

(56) References Cited

U.S. PATENT DOCUMENTS

| | | | |
|---|---|---|---|
| 4,235,644 A | | 11/1980 | Needes |
| 5,011,565 A | * | 4/1991 | Dube et al. ............ 438/98 |
| 7,291,380 B2 | * | 11/2007 | Nyholm et al. ......... 428/209 |
| 2004/0200520 A1 | | 10/2004 | Mulligan et al. |
| 2005/0022862 A1 | | 2/2005 | Cudzinovic et al. |
| 2005/0034755 A1 | * | 2/2005 | Okada et al. .......... 136/256 |
| 2005/0189013 A1 | * | 9/2005 | Hartley ................. 136/256 |
| 2006/0102228 A1 | | 5/2006 | Sridharan et al. |
| 2007/0098996 A1 | * | 5/2007 | Frey et al. ............. 428/422 |
| 2007/0169806 A1 | | 7/2007 | Fork et al. |
| 2007/0221270 A1 | * | 9/2007 | Watsuji et al. .......... 136/256 |
| 2009/0020156 A1 | * | 1/2009 | Ohtsuka et al. ......... 136/256 |
| 2009/0025786 A1 | * | 1/2009 | Rohatgi et al. .......... 136/256 |

OTHER PUBLICATIONS

U.S. Appl. No. 11/962,987, filed Dec. 21, 2007 (Baomin Xu et al.).
D. Meier et al.; "Solar Cell Contacts"; IEEE; pp. 904-910 (1982).
Zheng-Chun Liu et al.; "Self-assembly monolayer of mercaptopropyitrimethoxysilane for electroless deposition of Ag"; Materials Chemistry and Physics; vol. 82; pp. 301-305 (2003).
C. R. K. Marrian et al.; "Low voltage electron beam lithography in self-assembled ultrathin films with the scanning tunneling microscope"; Appl. Phys. Lett.; vol. 64; pp. 390-392 (Jan. 17, 1994).

* cited by examiner

*Primary Examiner*—W. David Coleman
(74) *Attorney, Agent, or Firm*—Oliff & Berridge, PLC

(57) ABSTRACT

Methods for forming a photovoltaic cell electrode structure, wherein the photovoltaic cell includes a semiconductor substrate having a passivation layer thereon, includes providing a plurality of contact openings through the passivation layer to the semiconductor substrate, selectively plating a contact metal into the plurality of contact openings to deposit the contact metal, depositing a metal containing material on the deposited contact metal, and firing the deposited contact metal and the deposited metal containing material. The metal containing material may include a paste containing a silver or silver alloy along with a glass frit and is substantially free to completely free of lead. The methods may also use light activation of the passivation layer or use seed layers to assist in the plating.

24 Claims, 7 Drawing Sheets

METHODS FOR FORMING MULTIPLE-LAYER ELECTRODE STRUCTURES FOR SILICON PHOTOVOLTAIC CELLS

BACKGROUND

Described herein are methods for forming multiple-layer electrode structures for silicon photovoltaic cells, that is, for silicon solar cells. The methods provide silicon solar cells having low contact resistance with a small contact area, and thus an improved contact resistivity over electrode structures formed with the use of glass frit. The methods also are able to provide reduced environmental concerns compared to the use of lead-based glass frit, a significant advancement as solar energy is a so-called "clean" energy.

Solar cells are typically photovoltaic devices that convert sunlight directly into electricity. Solar cells typically include a silicon semiconductor that absorbs light irradiation, such as sunlight, in a way that creates free electrons, which in turn are caused to flow in the presence of a built-in field to create direct current (hereinafter "DC") power. The DC power generated by several photovoltaic (PV) cells may be collected on a grid associated with the cells. Current from multiple PV cells is then combined by series and parallel combinations into higher currents and voltages. The DC power thus collected may then be sent over wires, often many dozens or even hundreds of wires. The DC power may also be converted to AC power using well-known inverters.

To form metal contacts able to gather and convey the generated power, the solar cell material is metallized. For silicon solar cells, metallization typically comprises forming a grid-like metal contact, for example including fine fingers and larger busbars, on a front surface of the cell and forming a full area metal contact on the back surface of the cell. Conventionally, metallizing silicon solar cells is done by screen printing. Screen printing has been used for decades, and is a robust, simple, rapid, and cost-effective metallization method and can be easily automated for large-scale solar cell manufacturing. In a conventional screen printing approach to metallization solar cells, a squeegee presses a paste through a mesh with a pattern that is held over the wafer. A typical paste for solar cell metallization consists of a mixture of silver particles, a lead-based glass frit and an organic vehicle. When the wafer is fired (annealed), the organic vehicle decomposes and the lead-based glass frit softens and then dissolves the surface passivation layer, creating a pathway for the silver to reach the silicon base by forming a multitude of random points under a silver pattern formed by the paste. The surface passivation layer, which may also serve as an anti-reflection coating, is a dielectric layer, such as a silicon nitride layer, and is an essential part of the cell covering the cell except for electrical contact areas. Upper portions of the silver paste densify into one or more films that carries current from the cell. These films form gridlines on the front-side of the wafer, and a base contact on a backside of the wafer. The silver of the paste is also a surface to which tabs connecting adjacent cells may be soldered.

While the use of a lead-based glass frit combined with screen printing has advantages, it also has several drawbacks. First, contact resistivity, or specific contact resistance, is very large, for example, specific contact resistance between the semiconductor emitter layer (sun-exposed surface) and the silver gridline is on the order of about $10^{-3}$ $\Omega \cdot cm^2$. This specific contact resistance between the silicon semiconductor emitter layer and the silver gridline is several orders of magnitude higher than the specific contact resistance that may be reached in semiconductor integrated circuit devices, which is on the order of about $10^{-7}$ $\Omega \cdot cm^2$. The large contact resistivity is the result of a low effective contact area between the silicon semiconductor emitter layer and the silver electrode gridline due to the non-conductive glass frit occupying a considerable portion of the interface. Due to the large specific contact resistance, the emitter layer in a solar cell must be heavily doped and large contact area between the emitter and silver gridline must be used, otherwise the silver of the paste cannot make good electrical contact to the silicon. The heavy doping kills the minority carrier lifetime in the top portion of the cell and limits the blue response of the cell, and the large contact area generates higher surface recombination rate. As a result, the overall efficiency of the solar cell is reduced.

Another problem with the glass frit approach is a narrow process window. The narrow process window may be a problem because a thermal cycle, that fires the gridline, must burn through the silicon nitride to provide electrical contact between the silicon and the silver without allowing the silver to shunt or otherwise damage the junction. This narrow process window severely limits the process time to the order of about 30 seconds and temperature band to about 10° C. around the peak firing temperature.

Still further, the use of lead-based glass frit, required to dissolve portions of the passivation layer, raises environmental concerns.

Ideally, a metallization technology for silicon solar cells should form the gridline electrodes with low specific contact resistance and thus low contact area, high conductivity, good solderability, and long time stability. Because it is very difficult for a single layer electrode to meet all these requirements, several methods for forming multiple-layer electrode structures have been proposed for silicon solar cells.

U.S. Patent Application Publication No. 2007/0169806, incorporated herein by reference in its entirety, discloses forming multiple-layer gridline front surface electrodes by forming contact openings through the passivation layer using a non-contact patterning apparatus such as a laser-based patterning system. The contact openings may be filled by inkjet printed nanophase metallic inks and covered with silver gridlines. However, several problems associated with using printed nanophase metallic inks for filling the contact openings include quality and availability of the nanophase metallic inks, the wetting behavior and contact characteristic between the nanophase metallic ink and the silicon surface in the contact openings, and the process compatibility of nanophase metallic ink with firing silver gridlines.

U.S. Patent Application Publication No. 2004/0200520 discloses a multiple-layer backside electrode structure that is formed by making contact openings through chemically etching the passivation or anti-reflection coating layer, followed by sputtering or evaporating a three layer-seed metal stack to form the contact with emitter and plating copper and a thin metal capping layer to form gridlines. However, chemically etching the passivation layer involves several extra process steps including applying an etch resist layer, patterning the etching resist layer, and striping off the etching resist layer after patterning the passivation layer.

U.S. Patent Application Publication No. 2005/0022862 discloses screen printing a liquid ink pattern layer devoid of particles onto the silicon oxide passivation layer to form a particle-devoid ink pattern layer as an etching protection mask.

It is still deemed desirable to develop more cost efficient and/or less complex methods of forming metallization contact structures for solar cells that provide low contact resistance, low contact area, high conductivity, high solderability, and high stability from solar exposure.

SUMMARY

Described herein are methods for forming a photovoltaic cell electrode structure, wherein the photovoltaic cell comprises a semiconductor substrate having a passivation layer thereon, comprising providing a plurality of contact openings through the passivation layer to the semiconductor substrate, selectively plating a contact metal into the plurality of contact openings to deposit the contact metal, depositing at least one metal containing layer over the deposited contact metal to form metal gridlines, and firing the deposited contact metal and the deposited metal containing material. In embodiments, the metal containing material may include a paste containing a silver or silver alloy along with a glass frit and is substantially free to completely free of lead, while in further embodiments, the methods may also use light activation of the passivation layer or use seed layers to assist in the plating.

Also described is a method for forming a photovoltaic cell electrode structure, wherein the photovoltaic cell comprises a semiconductor substrate having a passivation layer thereon, comprising depositing a photographic emulsion layer on a surface of the passivation layer; providing a plurality of contact openings through the photographic emulsion layer and the passivation layer to the semiconductor substrate; developing the emulsion layer at portions on and surrounding one or more of the plurality of contact openings to form an image comprised of silver metal atoms; selectively plating a contact metal at the developed portions of the photographic emulsion layer and in the plurality of contact openings to deposit the contact metal; depositing at least one metal containing layer over the deposited contact metal to form metal gridlines; and firing the deposited contact metal and the deposited metal containing material.

Further described is a method for forming a photovoltaic cell electrode structure, wherein the photovoltaic cell comprises a semiconductor substrate having a passivation layer thereon, the method comprising providing a plurality of contact openings through the passivation layer to the semiconductor substrate; selectively plating a contact metal into the plurality of contact openings to deposit the contact metal; depositing at least one metal containing layer over the deposited contact metal to form metal gridlines; and firing the deposited contact metal and the deposited metal containing material, wherein the method further comprises one of (a) light activating portions of the surface of the passivation layer surrounding one or more of the plurality of contact openings, wherein the selective plating of the contact metal into the plurality of contact openings also deposits the contact metal onto the light activated portions of the passivation layer, (b) depositing a light sensitive seed layer over the passivation layer prior to forming the plurality of contact openings in the passivation layer, and light activating the seed layer in portions on and surrounding one or more of the plurality of contact openings, wherein the selective plating of the contact metal deposits the contact metal at light activated portions of the seed layer and in the plurality of contact openings, or (c) depositing a self-assembled monolayer material over the passivation layer following forming the plurality of contact openings in the passivation layer at portions on and surrounding one or more of the plurality of contact openings, and wherein the selective plating of the contact metal deposits the contact metal on the self-assembled monolayer and in the plurality of contact openings.

EMBODIMENTS

Figure 1:
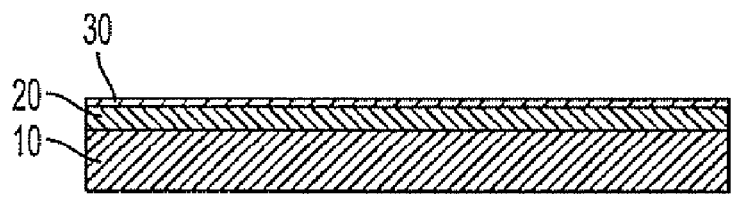
FIGS. 1-4 illustrate a method for forming a multiple-layer electrode structure using electroless plating to deposit a contact metal and forming on the contact metal a metal gridline formed from a metal containing material and a glass frit that is substantially free to completely free of lead.

Described herein are methods for forming a photovoltaic cell electrode structure, wherein the photovoltaic cell comprises a semiconductor substrate having a passivation layer thereon, wherein the methods commonly share the steps of providing a plurality of contact openings through the passivation layer to the semiconductor substrate, selectively plating a contact metal into the plurality of contact openings to deposit the contact metal, depositing at least one metal containing layer over the deposited contact metal to form metal gridlines, and firing the deposited contact metal and the deposited metal containing material. "Over" herein refers to, for example, a layer being formed directly on an underlying layer, or being formed over the layer, for example with other layers intervening therebetween. The at least one metal containing layer may form a metal gridline of the photovoltaic cell, and may be a single layer metal or a multiple layer metal such as a first layer of copper and the like with a second layer of silver and the like. One or more conductive buffer layers may also be formed over the deposited contact metal prior to deposition of the at least one metal containing layers.

Thus, described are methods to metallize silicon photovoltaic cells based on writing contact openings through the passivation layer and selective deposition of contact metals into and/or around the contact openings. In one embodiment, a laser is used to write contact openings in the form of lines, dots and the like, that underlie metal gridlines. A contact metal such as Ni, Co, Ti and the like is selectively deposited in the laser drilled contact openings to form a metal/emitter contact by methods such as, for example, electroless plating. The contact metal may be electroless plated as it is readily deposited on the conductive silicon emitter surface but not on an insulating surface such as that of an unaltered passivation layer, for example an unaltered silicon nitride layer. Metal gridlines, for example of silver, copper, alloys thereof and the like, may then be formed on or over the thin contact metal layer, for example by screen printing or co-extrusion. As above, the metal gridlines may be formed directly on the contact metal layer, or may be formed on one or more conductive buffer layers that are formed on or over the metal contact layer. The structure is then co-fired to complete the metallization.

The semiconductor substrate may be made of, for example, a semiconductor material, such as silicon and the like.

The passivation layer is comprised of a dielectric material. Suitable dielectric materials for the passivation layer on the semiconductor substrate include, for example, an oxide such as $SiO_2$ or $TiO_2$, or a nitride such as silicon nitride or silicon oxygen nitride, or combinations thereof. In the photovoltaic cell, the passivation layer may act as an antireflection film, particularly if the layer is formed on the front side of the cell, or on the back surface of the solar cell if it is a bifacial cell.

The one or more contact openings may be formed in the passivation layer by a non-contact patterning apparatus, for example by use of a laser. In embodiments, the one or more contact openings may include one or a plurality of holes, one or a plurality of lines, a combination of one or a plurality of holes and one or a plurality of lines, or one more additional shapes or configurations. The diameter of holes may be in a range of, for example, about 1 µm to about 200 µm, such as from about 5 µm to about 100 µm or from about 10 µm to about 50 µm. The holes may have a pitch of, for example, about 0.01 mm to about 2 mm, such as from about 0.1 mm to about 1 mm or from about 0.2 mm to about 0.5 mm. Lines may include grooves or trenches in the passivation layer. The lines may have a width in a range of, for example, about 1 µm to about 200 µm, such as from about 5 µm to about 100 µm or from about 10 µm to about 50 µm.

The one or more contact openings may be formed by the non-contact patterning apparatus through the passivation layer to expose doped portions of the semiconductor substrate and to open the top side of the semiconductor substrate.

In embodiments, the non-contact patterning apparatus may be a laser device capable of generating laser pulses of sufficient energy to ablate (remove) portions of the passivation layer to form the one or more contact openings therein that expose the top side of the semiconductor substrate. Advantages of laser ablation include that there is typically no need for cleaning, rinsing, drying or other processing following laser ablation and prior to metallization. The non-contact patterning apparatus may also be a particle-beam generating apparatus that forms the one or more openings in the passivation layer, such as an ion milling apparatus.

In embodiments, the laser may be a Coherent Inc. model AVIA 266-300 Q-switched Nd-YAG operating at a pulse repetition rate on the order of about 100 KHz. The fluence needed to ablate the surface of the passivation layer is on the order of, for example, about 1 Joule/cm². The pulse length of the laser is on the order of tens of nanoseconds. The wavelength may be on the order of about 266 nm. The short pulse and wavelength of such lasers ensure that the energy is deposited near the surface and melting in the semiconductor substrate is minimal. This minimizes any change to the doping profile of diffusion regions of the semiconductor substrate. The energy of a 266 nm photon is about 4.66 electron volts. Although the bandgap of the passivation layer varies over a wide range, this photon energy is comparable to the band gap of silicon nitride in its most transparent forms. These highly energetic photons are absorbed in the surface of the passivation layer and/or in the topmost nanometers of the underlying semiconductor substrate. A lightly doped emitter will have a phosphorous diffusion depth of about 200 nm, a sheet resistance on the order of about 100 ohms, and a non-degenerate level of dopant at the physical surface. The material of the semiconductor substrate may be a good thermal conductor causing rapid quenching of the semiconductor substrate melt formed below the surface of the passivation layer. In embodiments, suitable control of the process conditions allows removal of the passivation layer without significantly altering the thickness or doping profile of the underlying semiconductor substrate.

In embodiments, the laser apparatus includes a femtosecond laser. An advantage of using a femtosecond laser is that the laser energy can be deposited in a timeframe that is faster than the time required for the material to reach thermal equilibrium. Thus, the passivation layer can be ablated with less debris.

In embodiments, other contact or non-contact patterning apparatus or methods can also be employed to form the one or more openings. For example, the one or more openings can be formed by chemical etching through direct printing of an etchant material onto the passivation layer, for example using ink jet printing, screen printing, pad printing or other printing method. Alternatively, the chemical etching may also be performed by direct printing an etching protective mask onto the passivation layer and then putting the substrate into an etching solution. The etching protection mask can also be formed by spin coating, spray coating or evaporating a protection layer followed by patterning the protection layer.

The contact metal filling the contact openings is a conductive metal. The conductive contact metal layer may be, for example, a thin metal layer that has a low contact resistance and/or a robust adhesion to the semiconductor substrate or an n⁺ emitter of the semiconductor substrate. Silicide forming conductive metals, that is, metals that form a silicide with silicon, are desirably used. In embodiments, the conductive contact metal may comprise a conductive metal material such as nickel (Ni), cobalt (Co), titanium (Ti), tantalum (Ta), tungsten (W), molybdenum (Mo), alloys thereof and the like. When Ni is used, it may or may not contain phosphorus.

The contact metal may be deposited into the contact openings by any selective deposition methods, including suitable plating techniques. The deposited contact metal may have a thickness ranging from, for example, about 1 nm to about 2,000 nm, such as from about 5 nm to about 1,000 nm or from about 20 nm to about 200 nm.

In plating, including electroless plating, the metal is built up from the molecular level. Electroless plating selectively deposits the contact metal into the laser drilled contact openings, the selectivity being natural because the n-type conductive emitter of the semiconductor substrate provides electrons to reduce the metal ions, for example such as $Ni^{2+}$ ions, to metal elements such as Ni, thereby depositing the metal on the emitter and in the contact openings. An unaltered surface of the passivation layer, on the other hand, is insulating, such as with oxide and nitride layers, and thus cannot provide electrons necessary to achieve deposition on the surface of the unaltered passivation layer.

Any suitable plating method may be used. Electroless plating, also known as chemical or auto-catalytic plating, is a non-galvanic type of plating method that involves several simultaneous reactions in an aqueous solution, which occur without the use of external electrical power unlike in electroplating. Metal ions are produced, which are reduced as above to be deposited on the surface being electroplated. In the process, the sample to which the metal is to be plated is placed in the plating solution, and plating is conducted to deposit the metal. Selective electroless plating can be realized due to the different physical or chemical properties of the surfaces (for example, a conductive or semiconductive surface vs. an insulating surface), by selectively depositing and activating a seed layer on the surface, or selectively activating the surface using such as a laser exposure. In another approach to introducing a contact metal, the method of light induced plating may be used. Although this method is commonly used to add metal to an existing metal line on the n-type portion of a solar cell as described in Mette et al., Increasing the Efficiency of Screen-Printed Silicon Solar Cells by Light-Induced Silver Plating, 2006 IEEE 4$^{th}$ World Conference on Photovoltaic Energy Conversion, May 7-12 (2006), it is also possible to use light induced plating to apply metal directly to the silicon, thereby selectively providing a contact metal into the contact opening.

When metals such as nickel, cobalt, titanium, tantalum, tungsten or molybdenum are used as the conductive contact metal, during or after the thermal processing of the structure, a metal silicide layer, such as a nickel silicide layer, may form at the interface between the conductive contact metal and the semiconductor substrate.

Following deposition of the contact metal by plating, at least one conductive metal layer for forming the metal gridlines may be formed on or over the contact metal, for example by well known techniques such as screen printing, co-extrusion, extrusion, pad printing, jet printing, dispensing and the like, or by plating techniques such as electroplating or electroless plating as described above. The metal gridlines may be comprised of, for example, silver, tin, copper, alloys thereof and the like. The metal gridlines may comprise single layers, or may comprise multiple layers, such as a layer of copper with a layer of silver thereon. The gridline layer may be as thin as, for example about 1 micron, and may have a thickness of from, for example, about 1 to about 150 microns, such as from about 5 to about 50 microns.

The metal gridlines may be formed directly on the contact metal layer, or may be formed on one or more conductive buffer layers that are formed on the metal contact layer. Buffer layers may be used to prevent diffusion of the metal of the gridlines into the semiconductor substrate, and they can be selectively formed or deposited on the contact metal layer by the methods such as electroless plating, light induced plating or electroplating described above. The buffer layer(s) may have a conductivity greater than that of the contact metal layer. The buffer layer(s) may be comprised of, for example, tungsten, chromium, titanium, alloys thereof and the like. The buffer layer(s) may have a thickness of from, for example, about 0.1 to about 50 microns, and where the metal gridlines formed on the buffer layer(s) may have a thickness of from, for example, about 1 to about 150 microns.

To complete the metallization, the structure is subjected to a thermal treatment such as co-firing. The structure may be thermally processed by firing at a temperature from, for example, about 200° C. to about 1,000° C., such as from about 400° C. to about 900° C. or from about 500° C. to about 850° C., thereby deriving a metallized structure.

In embodiments, the method can also be used to make a multiple-layer electrode structure for back surface contact solar cells. That is, the method may be applied to a backside of the semiconductor substrate to make backside electrodes for the semiconductor substrate if one or more p regions and/or one or more n regions are made on the backside of the semiconductor substrate.

The multiple-layer electrode structure formed by the methods herein may reduce contact resistance and contact area between the semiconductor substrate and the current carrying metal gridlines, and may form the electrode structure with higher height vs. width aspect ratios. As a result, an increase in the absolute efficiency of a silicon photovoltaic cell including the multiple-layer electrode structure of, for example, about 0.5% to about 3% compared to current photovoltaic cells may be realized, which may result in a relative improvement for the silicon photovoltaic cell of, for example, about 4% to about 20%.

The multiple-layer electrode structure and the semiconductor substrate may have a contact area that may be reduced by a factor of about 50 to about 400 when compared to the contact area of conventional silicon solar cells. The decreased contact area may decrease recombination between the semiconductor substrate and the conductive contact layer and/or the metal gridlines. The multiple-layer electrode structure may include use of a lightly doped emitter layer and as a result, the blue response and light absorption can be improved. All these improvements may lead to increased efficiency. Further, a specific contact resistance between the multiple-layer electrode structure and the semiconductor substrate may be from smaller than about $10^{-1}$ ohm·cm$^2$ to about $10^{-8}$ ohm·cm$^2$, from smaller than about $10^{-2}$ ohm·cm$^2$ to about $10^{-8}$ ohm·cm$^2$ or from smaller than $10^{-4}$ ohm·cm$^2$ to about $10^{-8}$ ohm·cm$^2$.

The multiple-layer electrode structures and the methods for forming the multiple-layer electrode structures disclosed herein may be used to form other multiple-layer electrode structures besides photovoltaic or solar cells. For example, the methods may also be used to form any electric or electronic devices where low contact resistance and high current carrying electrodes are required. The methods disclosed herein may also be used to form any functional structures or devices that include a second layer functional material that may be deposited on a portion of the underlying first functional layer material.

In a first embodiment, the method includes the use of a glass frit in the material used for forming the metal gridline, wherein the glass frit is substantially free of to completely free of lead. In a second embodiment, a laser is used to activate additional surface area of the passivation layer around one or more of the contact openings, thereby enabling the contact metal to be deposited not only in the contact openings, but also around the contact openings. In a third embodiment, a seed layer is first deposited on the passivation layer, which seed layer is activated when the contact openings are formed with a laser, and the activated seed layer allowing the selective plating of the contact metal to occur. Alternatively, a photographic emulsion layer may be used as the seed layer, which can be developed via exposure to light. In a fourth embodiment, patterns of self-assembled monolayers are printed onto the contact openings after formation, acting as seed layers for the plating of the contact metal.

The general methods described herein, including the first embodiment above, will be described with reference to FIGS. 1-4. FIG. 1 shows a semiconductor substrate 10 including an n+ emitter layer 20. On the n+ emitter surface of the semiconductor substrate is a passivation layer 30, such as a silicon nitride layer.

Figure 2:
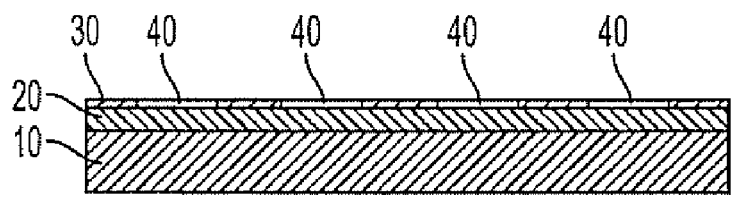

FIG. 2 illustrates contact openings 40 formed in the passivation layer, for example with a laser device as described above.

Figure 3:
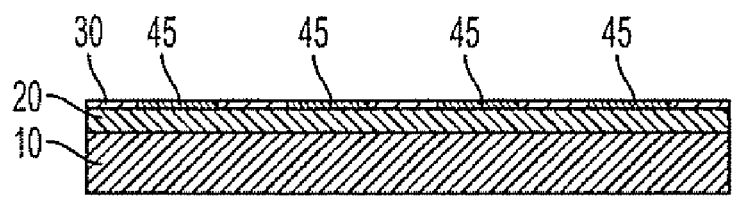

FIG. 3 illustrates a contact metal 45 filled into the contact openings 40 by plating, such as electroless plating. In this embodiment, as described above, the plating metal is deposited only in the contact openings and not on any of the remaining unaltered surface of the passivation layer.

Figure 4:
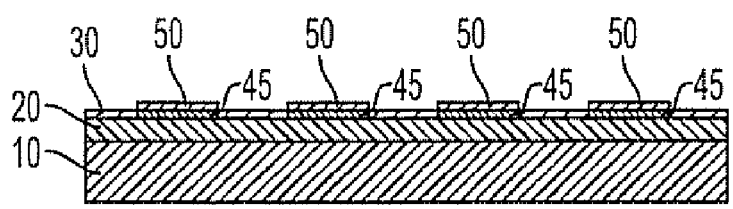

FIG. 4 illustrates a metal gridline 50 formed over each of the metal contact openings containing the plated contact metal. As described above, the metal gridline 50 may be formed by any suitable technique, such as co-extrusion or screen printing.

In the method of the first embodiment, in contrast to a conventional screen printing that must use a very aggressive lead containing glass frit in a silver paste used to form the metal gridline, the material for forming the metal gridline is substantially free of to completely free of lead. In the silver paste for conventional screen printing, the glass frit usually contains about 15 to 75 mol % lead and/or PbO, as described in U.S. Patent Application Publication No. 2006/0102228 A1. For the glass frit used in the silver paste for the first embodiment herein, the lead or PbO can be substantially to completely omitted from the metal containing material for forming the gridlines. That is, the content of lead or PbO may be less than 10 mol %, such as less than 5 mol %, and the glass frit can even contain no lead or PbO at all. In the conventional screen printing process, the glass frit is used as an etching agent that dissolves the passivation layer during firing of the structure, allowing the silver to penetrate through the passivation layer to form the required silicon-silver contact. Lead (or lead oxide PbO) is required because it can dissolve a passivation layer such as a silicon nitride. However, this process is not only somewhat unreliable, the use of lead is not desirable. In this first embodiment, lead can be substantially to completely omitted from the metal containing material for forming the gridlines as the contact openings are previously formed by laser ablation. The metal gridline material thus may include, along with the conductive metal for the gridline, a mild glass frit that is substantially to completely free of lead, which glass frit is used to promote the adhesion of the metal line to the surface of the structure it is in contact with and to serve as a flux to aid the solid state sintering reaction between the metal particles of the metal gridline.

In embodiments, the mild glass frit may be any suitable material, such as $B_2O_3$ or $SiO_2$, with or without additional materials such as $Bi_2O_3$, $In_2O_3$, $SnO_2$, $V_2O_5$, or ZnO. The metal containing material may include a paste containing a silver or silver alloy along with the glass frit, the material being substantially free to completely free of lead. Typically, the silver paste may comprise from about 80 to 99 wt % of silver, from about 1 to 20 wt % of glass frit, and from 1 to about 25 wt % of organic vehicle.

When sputtered nickel is used as the contact metal and a screen printed silver paste is used for the metal gridlines, and the structure is co-fired at 500° C., an electrode is formed which has about two orders of magnitude smaller contact resistivity than a conventionally screen printed electrode, for example with a specific contact resistance of about 0.01 mΩ·cm² compared to 1 to 3 mΩ·cm² using the conventional screen printed silver electrode.

Figure 5:
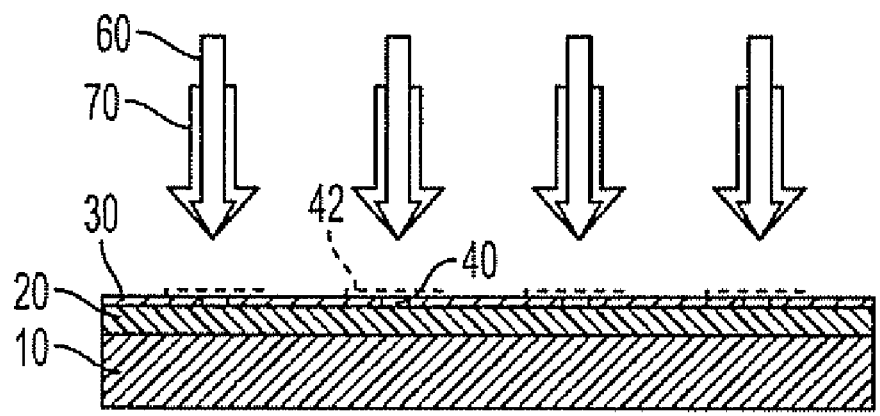
FIGS. 5-7 illustrate a method for forming a multiple-layer electrode structure using laser writing to form contact openings, electroless plating to deposit a contact metal in and around the contact openings, and forming on the contact metal a metal gridline.

The method of the second embodiment described herein will be described with reference to FIGS. 5-7.

In a second embodiment, the method includes the use of two laser beams in the formation of the contact openings. The first energy beam is the energy beam to actually cut the contact openings, and is thus the energy beam as described above. For example, the first energy beam is a well-focused, high-energy density narrow beam, or example about 20 microns wide, which forms the contact hole openings in the passivation layer. The second laser beam is a wider beam, for example about 40 to about 150 microns wide, with a lower energy density than the first energy beam. The second energy beam is used to activate the surface of the passivation layer, but does not destroy the passivation layer. Generally, the fluence for the first laser beam is about 5 to 10 J/cm² and the fluence for the second laser beam is about 1 to 3 J/cm² or less. The first and second beams are aligned, typically with the first laser beam in the middle of the second laser beam. In this manner, the region of the passivation layer contacted by the first laser beam is ablated to form the contact openings, and the region surrounding the contact openings contacted by the second beam is altered but not removed, permitting that region to received plated metals.

The portions of the passivation layer contacted by the second beam are thus light activated. This light, or laser, activation is believed to enable metal to be subsequently plated on the activated regions of the dielectric passivation layer as a result of the exposure causing local variation of the electronic structure and leading to the appearance of non-zero density of electrostatic states in the vicinity of the electrochemical potential or autocatalytic metal reduction, which promotes the metal deposition by plating.

In the method of this embodiment, a semiconductor substrate structure as illustrated in FIG. 1 may be used to start. FIG. 5 illustrates application of first laser beam 60 and second laser beam 70 to the passivation layer 30, the first laser beam forming contact openings 40 in the passivation layer, and the second laser beam forming activated surface portions 42 around the contact openings 40.

Figure 6:
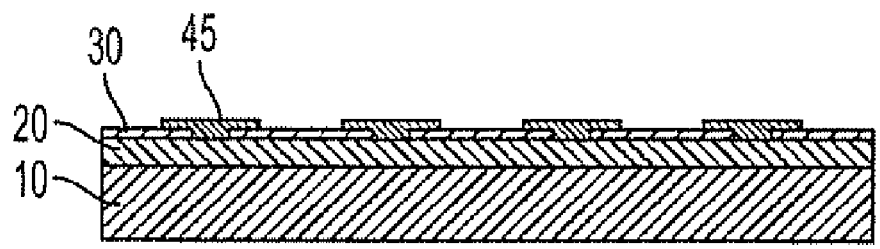
Figure 7:
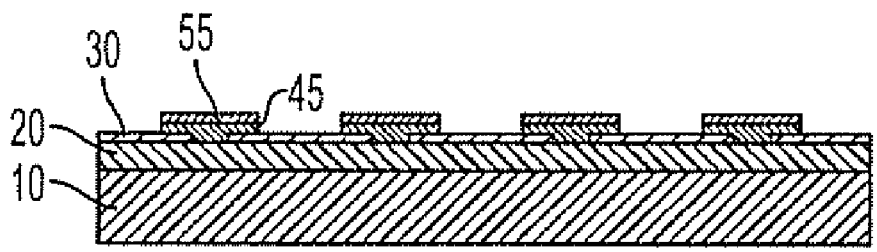

FIG. 6 illustrates a contact metal 45 filled into the contact openings 40 and onto the activated portions 42 by plating, such as electroless plating. In this embodiment, the plating metal is deposited not only in the contact openings, but also around the contact openings. Using this thin contact metal layer as a seed layer, a thicker layer of a more conductive metal, such as silver, copper, or tin may be deposited using a plating technique such as electroplating or electroless plating to form the metal gridlines. Optionally, more than one metal layer, such as a copper layer followed by a tin or silver layer, may also be deposited in order to improve both the conductivity and the solderability of the gridlines. On the other hand, if it is needed, a buffer layer, such as a thin tungsten or chromium layer, may also be deposited prior to depositing the thicker, more conductive metal layer or layers. Deposition of a thick metal layer 55 on the plated contact metal layer 45 is shown in FIG. 7. The process of this embodiment thus may eliminate the need to use screen printing or co-extrusion to form metal gridlines. It is also possible to make the electrode structure with greater height:width aspect ratios, such as an aspect ratio of larger than 1:2, compared to an aspect ratio of about 1:10 with conventional screen printing methods. Finally, these metal layers will be fired at such as 200 to 1000° C. to enhance the adhesion and density.

A third embodiment is shown in FIGS. 8-12. This embodiment is similar to the second embodiment, but instead of using a second laser to activate the surface of the passivation layer, a photosensitive organometallic seed layer is coated onto the passivation layer and used as a seed layer for the plating of the contact metal.

Figure 8:
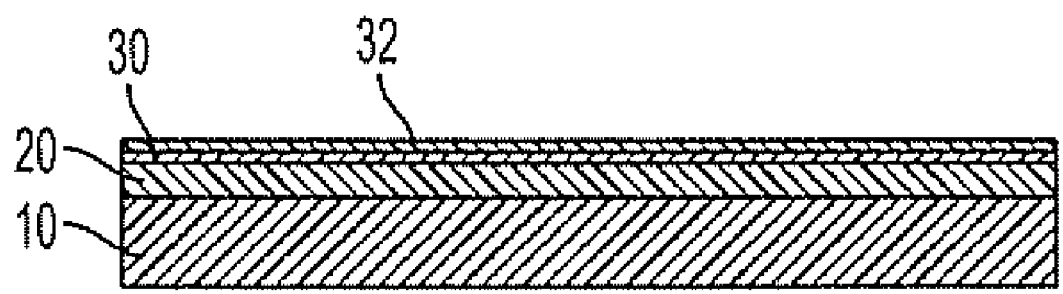
FIGS. 8-12 illustrate a method for forming a multiple-layer electrode structure using a photosensitive organometallic seed layer, laser writing to form contact openings and decompose the seed layer, electroless plating to deposit a contact metal and forming on the contact metal a metal gridline.

FIG. 8 shows a semiconductor substrate 10 including an n+ emitter layer or portion 20. On the n+ emitter surface of the semiconductor substrate is a passivation layer 30, such as a silicon nitride layer. Further, on the passivation layer is the photosensitive organometallic seed layer 32. The seed layer 32 is desirably deposited over the entire surface of the passivation layer by any suitable technique, for example such as spin coating, casting or spray coating. The seed layer 32 may have a thickness of from, for example, about 0.1 microns to about 10 microns.

As the photosensitive organometallic seed layer, any suitable material may be used. Examples of the seed layer include, for example, organometallic compounds including one or more of platinum, palladium, copper, rhodium, tungsten, iridium, silver, gold and tantalum. Specific examples of organometallic compounds include palladium acetylacetonate ($Pd(acac)_2$), palladium sulfate ($PdSO_4$), palladium acetate ($PdAc_2$). These organometallic compounds may be dissolved in a suitable solvent such chloroform ($CHCl_3$) or acetic acid (HAc), which may then be coated on the substrate by any suitable technique such as spin coating or spray coating.

Figure 9:
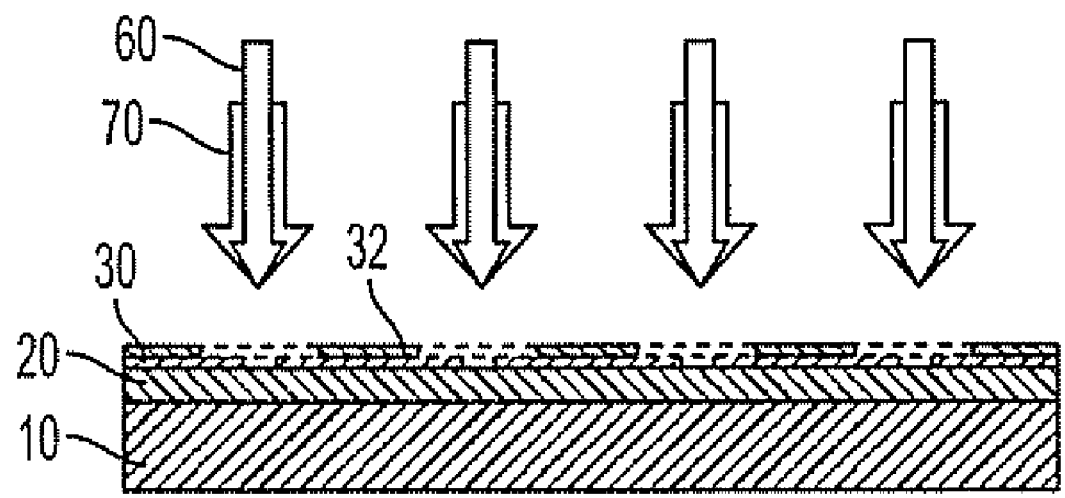
Figure 10:
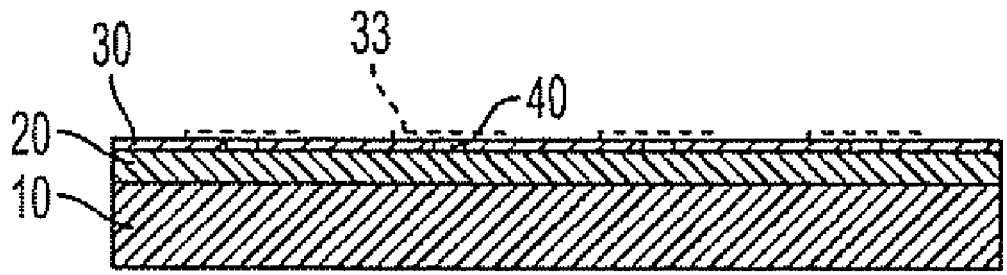

FIG. 9 illustrates exposure of the seed layer to a first laser beam 60 and a second laser beam 70 as in the second embodiment discussed above. The light activation of the seed layer by the second laser beam decomposes the seed layer to form a thin metal layer 33 on the surface of the passivation layer as shown in FIG. 10. The thickness of the formed seed layer may be from, for example, about 0.1 microns to 10 microns. Other metals may then be deposited on the seed layer by a plating technique. The unexposed, and thus un-decomposed, portions of the seed layer 32 may be easily washed away using a suitable solvent such as deionized water.

Figure 11:
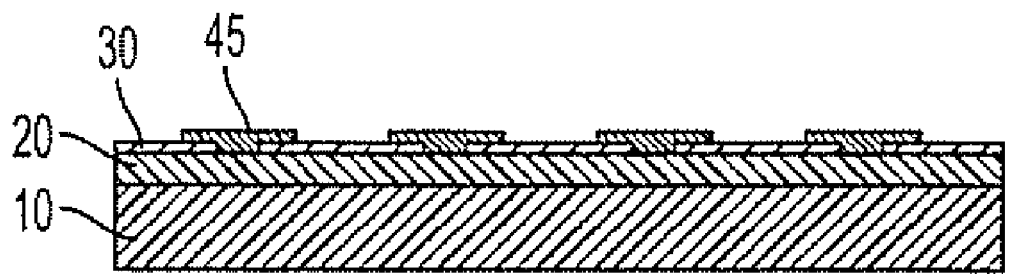
Figure 12:
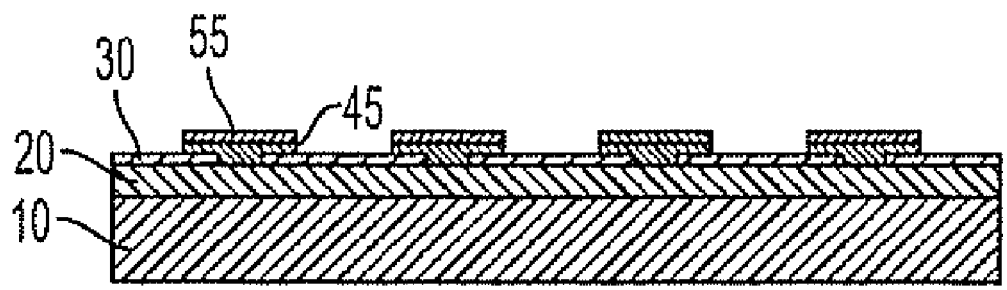

FIG. 11 illustrates a contact metal 45 filled into the contact openings 40 and onto the seed layer portions 33 by plating, such as electroless plating. In this embodiment, the plating metal is deposited not only in the contact openings, but also around the contact openings at the locations of the seed layer 33. Using this thin contact metal layer as a seed layer, a thicker layer of a more conductive metal, such as silver, copper, or tin may be deposited using a plating technique such as electroplating or electroless plating to form the metal gridlines. Optionally, more than one metal layer, such as a copper layer followed by a tin or silver layer, may also be deposited in order to improve both the conductivity and the solderability of the gridlines. On the other hand, if it is needed, a buffer layer, such as a thin tungsten or chromium layer may also be deposited prior to depositing the thicker, more conductive metal layer or layers. Deposition of a thick metal layer 55 on the plated contact metal layer 45 is shown in FIG. 12.

An alternative third embodiment is illustrated in FIGS. 13-18. This alternative is similar to the third embodiment in using a seed layer, but replaces the organometallic catalyst seed layer of the third embodiment, which typically is an expensive material, with a photographic emulsion seed layer.

Figure 13:
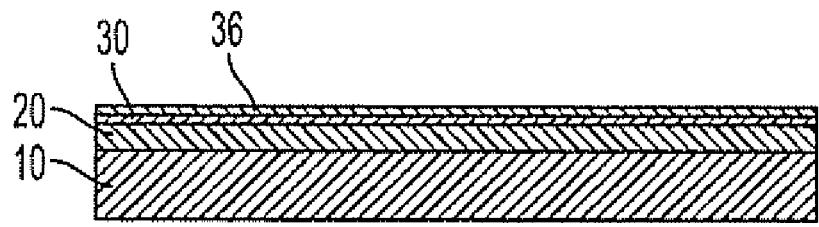
FIGS. 13-18 illustrate a method for forming a multiple-layer electrode structure using a photographic emulsion layer, laser writing to form contact openings, light exposure to develop the photographic emulsion layer, electroless plating to deposit a contact metal and forming on the contact metal a metal gridline.

FIG. 13 shows a semiconductor substrate 10 including an n+ emitter layer or portion 20. On the n+ emitter surface of the semiconductor substrate is a passivation layer 30, such as a silicon nitride layer. Further, on the passivation layer is the photographic emulsion seed layer 36. The seed layer 36 is desirably deposited over the entire surface of the passivation layer by any suitable technique, for example such as spin coating, casting or spray coating. The seed layer 36 may have a thickness of from, for example, about 0.1 microns to about 10 microns.

As the photographic emulsion material, any suitable material may be used. Generally, a photographic emulsion comprises one or more kinds of silver halides (chloride, bromide, iodide) crystals suspended in gelatin. Gelatin is a group of compounds with very complex molecular structures largely made of carbon, hydrogen, oxygen and nitrogen atoms having a composition of approximately 70, 7, 25, and 18 parts of these atoms, respectively. The gelatin acts as the protective colloid in that it prevents the silver halide crystals from coalescing, and also controls the size and distribution of the crystals to some extent.

Figure 14:
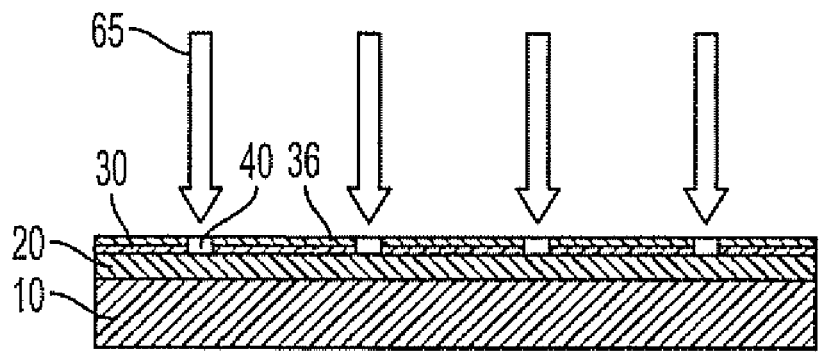

FIG. 14 illustrates exposure of the photographic seed layer and the passivation layer to a laser beam 65 as in the first embodiment above in order to form the contact openings 40 therein.

Figure 15:
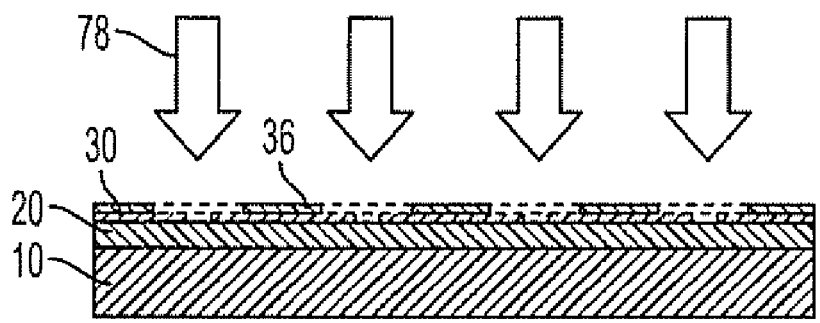
Figure 16:
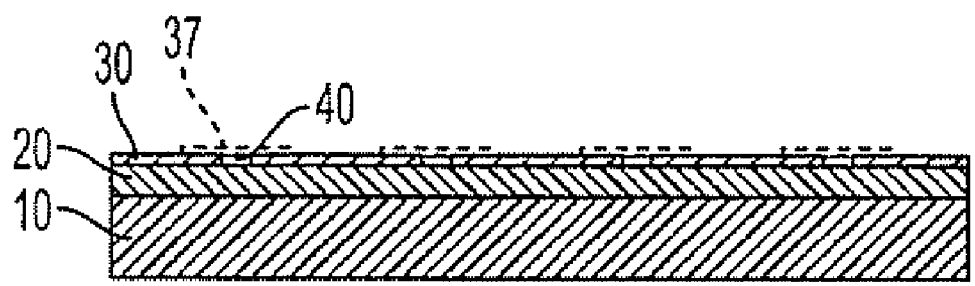

Then, as shown in FIG. 15, the photographic seed layer 36 is exposed to light 78 in order to develop the seed layer. In this way, using standard photographic film development techniques, a metal gridline image may be formed with seed layer portions 37 exposed to the light and remaining on the passivation layer surface following development as shown in FIG. 16. These developed seed layer portions 37 are thus used as the seed layer for subsequent deposition of the plating metal.

Figure 17:
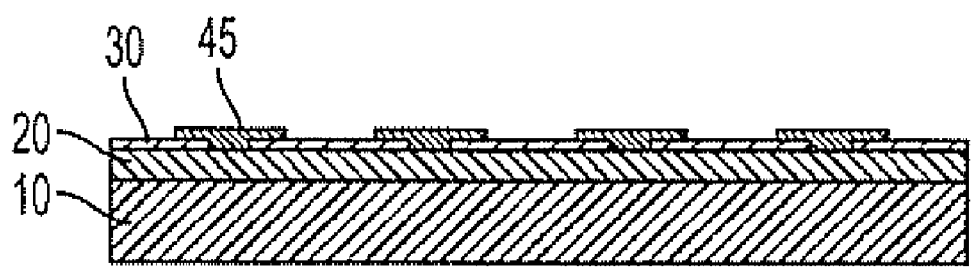
Figure 18:
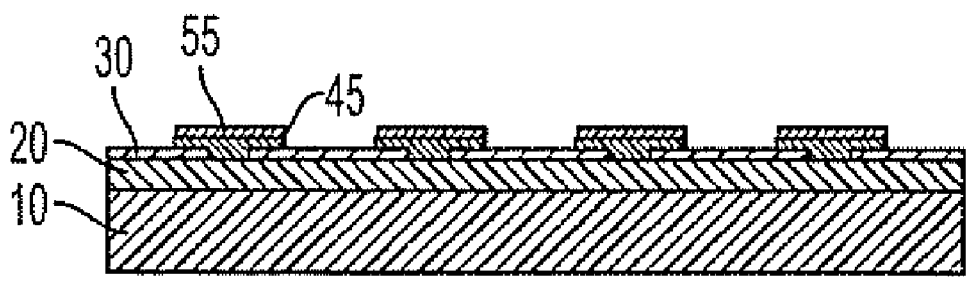

FIG. 17 illustrates a contact metal 45 filled into the contact openings 40 and onto the seed layer portions 37 by plating, such as electroless plating. In this embodiment, the plating metal is deposited not only in the contact openings, but also around the contact openings at the locations of the seed layer 37. Using this thin contact metal layer as a seed layer, a thicker layer of a more conductive metal, such as silver, copper, or tin may be deposited using a plating technique such as electroplating or electroless plating to form the metal gridlines. Optionally, more than one metal layer, such as a copper layer followed by a tin or silver layer, may also be deposited in order to improve both the conductivity and the solderability of the gridlines. On the other hand, if it is needed, a buffer layer, such as a thin tungsten or chromium layer may also be deposited prior to depositing the thicker, more conductive metal layer or layers. Deposition of a thick metal layer 55 on the plated contact metal layer 45 is shown in FIG.

In this embodiment, registration through the process with the laser ablated contact openings may be maintained via an in-line processing tool such as the conveyor system described in application Ser. No. 11/962,987, incorporated herein by reference in its entirety, in which a substrate passes on a conveyor past the laser patterning terminal, and on the same conveyor system, the substrate subsequently passes through the photographic emulsion development system.

Figure 19:
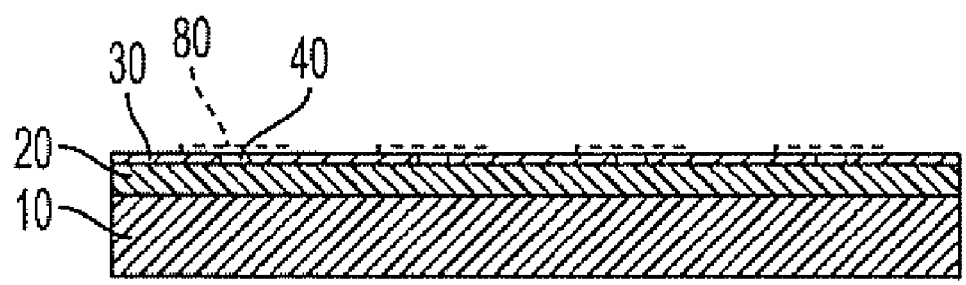
FIGS. 19-21 illustrate a method for forming a multiple-layer electrode structure using laser writing to form contact openings, printing a self-assembled organosilane monolayer over the contact openings, electroless plating to deposit a contact metal and forming on the contact metal a metal gridline.
Figure 20:
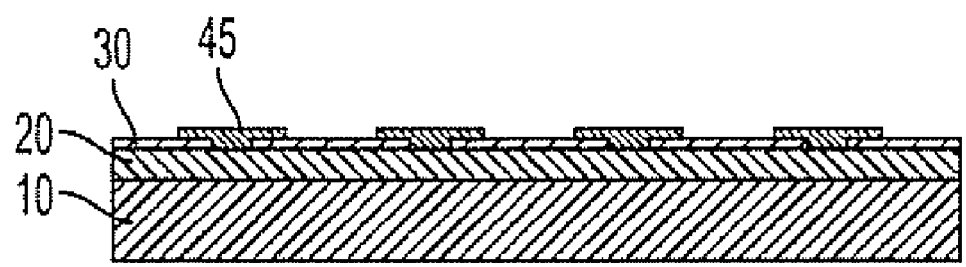
Figure 21:
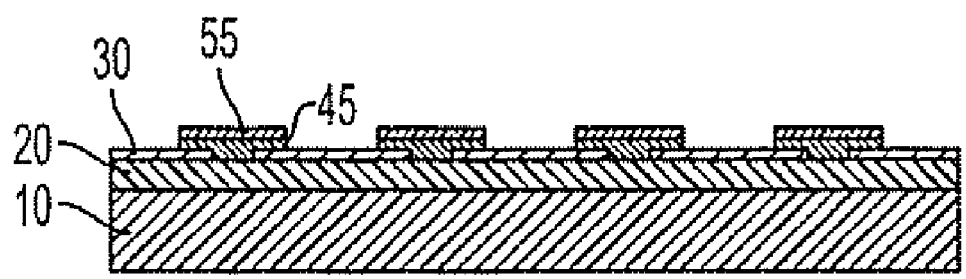

A fourth embodiment is shown in FIGS. 19-21. In this embodiment, self-assembled monolayers are used as seed layers for the deposition of contact metal by plating. Generally speaking, the forming of self-assembled monolayers is a chemical process in which precursor molecules, in a solution or vapor phase, react at interfaces to produce layers of monomolecular thickness, for example on the order of a few nanometers, that are chemically bonded to those surfaces. Rather than having to use a technique such as chemical vapor deposition or molecular beam epitaxy to add molecules to a surface (often with poor control over the thickness of the molecular layer), self-assembled monolayers may be prepared simply by adding a solution of the desired molecule onto the substrate surface and washing off the excess. The chemisorption reactions are thermodynamically driven to completion due to the lower free energy of the molecules when chemically bonded to the surface. Consequently, formation of stable, homogeneous and densely packed molecular layers over large surface areas is energetically favorable.

As the self-assembled monolayers used herein, any suitable material may be used. Examples suitable for use on nitride or oxide such as comprising the passivation layer include self-assembled organosilane monolayers, for example alkyl silanes. Specific example self-assembled monolayer materials include, for example, octadecyltrichlorosilane, PEDA ((aminoethylaminomethyl)phenethyltrimethoxysilane), CMPTS (4-chloromethylphenyltrichlorosilane), MPTS (γ-mercaptopropyltrimethoxysilane), combinations thereof and the like. The self-assembled monolayer material can either contain a ligating group such as an amine or pyridyl donor group or can graft a ligating group after treatment with another chemical such as an acetonitrile solution of lithium ethylenediamine (Li-EDA), which has an affinity for a metal complex catalyst. In this way, the metal catalyst, such as a Pd(II), a Pt(III), a colloid silver and the like, can be absorbed on the surface of the monolayer. The surface of the self-assembled monolayer may thus be used as a seed layer for deposition of the contact metal by plating.

The self-assembled monolayer materials are deposited on and over the contact openings following formation of the contact openings. The monolayers may be deposited by any suitable technique, for example such as jet printing.

The method of this fourth embodiment includes starting with a substrate structure as shown in FIG. 1 above, and subjecting the passivation layer 30 to a laser as described above and illustrated in FIG. 2 to form contact openings in the passivation layer.

FIG. 19 illustrates a subsequent step of jet printing the self-assembled monolayer material 80 on and around the contact openings 40. The monolayer material can be jetted as is, or in a solution with a solvent such as benzene, chloroform, methanol. The concentration of the solution may be, for example, from about 1 to 10 wt %, and the solvent may be evaporated by heating the substrate, for example to about 60° C. to 100° C. after jetting. Extra solution or monolayer material jetted onto the passivation layer surface may be removed, for example by washing.

The deposited self-assembled monolayer materials may then be subjected to exposure to a metal catalyst material, for example by immersing the monolayer in a metal catalyst solution containing, for example, Pd(II), Pt(III) or a silver colloid and the like, to form a catalyst metal on the monolayer surface. The monolayer may then act as a seed layer for plating deposition of the contact metal. Except using self-assembled monolayer materials, it is also possible to jet print a thin layer of an activator solution, such as a palladium-tin hydrosol, as a seed layer for plating deposition of the contact metal.

FIG. 20 illustrates a contact metal 45 filled into the contact openings 40 and onto the seed layer portions 80 by plating, such as electroless plating. In this embodiment, the plating metal is deposited not only in the contact openings, but also around the contact openings at the locations of the seed layer 80. Using this thin contact metal layer as a seed layer, a thicker layer of a more conductive metal, such as silver, copper, or tin may be deposited using a plating technique such as electroplating or electroless plating to form the metal gridlines. Optionally, more than one metal layer, such as a copper layer followed by a tin or silver layer, may also be deposited in order to improve both the conductivity and the solderability of the gridlines. On the other hand, if it is needed, a buffer layer, such as a thin tungsten or chromium layer, may also be deposited prior to depositing the thicker, more conductive metal layer or layers. Deposition of a thick metal layer 55 on the plated contact metal layer 45 is shown in FIG. 21.

During the subsequent co-firing of the structure, the plated metal, such as nickel, penetrates through the self-assembled monolayer to form a good metal/emitter contact with low contact resistivity.

The following Examples are submitted to further illustrate embodiments of the present disclosure.

Example

A silicon semiconductor substrate has a top side with a nitride passivation layer formed thereon. A plurality of holes are formed in the nitride passivation layer using, laser writing. Each of the plurality of holes has a diameter of about 20 μm and a pitch of about 0.25 mm. A Ni conductive contact layer is deposited onto the nitride passivation layer and into the plurality of holes formed in the nitride passivation layer. The Ni contact layer has a thickness of about 100 nm.

An Ag paste is deposited onto the Ni conductive contact layer via screen printing and is aligned or registered with the plurality of holes formed in the nitride passivation layer. Then the silicon substrate is fired at about 500° C. to form an Ag/Ni multiple-layer electrode structure having current carrying sintered Ag gridlines.

The Ag/Ni multiple-layer electrode has a contact resistance of about less than 0.03 ohm for a line having a length of about 25.4 mm. Further, the Ag/Ni multiple-layer electrode has a contact resistance of about less than 0.0063 ohm for a standard line having a length of about 121 mm. This is comparable to the contact resistance of a standard screen printed Ag gridline which is about 0.0055 ohm, but the contact area of the Ag/Ni multiple-layer electrode structure of the Example here is more than about 100 times smaller than the standard screen printed Ag gridline. This means the specific contact resistance, or contact resistivity, of the example here is more than about 100 times smaller than the standard screen printed Ag gridlines, as the specific contact resistance is equal to the product of the measured contact resistance times the contact area.

It will be appreciated that various of the above-disclosed and other features and functions, or alternatives thereof, may be desirably combined into many other different systems or applications. Also, it will be appreciated that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A method for forming a photovoltaic cell electrode structure, wherein the photovoltaic cell comprises a semiconductor substrate having a passivation layer thereon, the method comprising:
   providing a plurality of contact openings through the passivation layer to the semiconductor substrate;
   selectively plating a contact metal into the plurality of contact openings to deposit the contact metal;
   depositing at least one metal containing layer over the deposited contact metal to form metal gridlines; and
   firing the deposited contact metal and the at least one deposited metal containing layer,
   wherein the method further comprises depositing a self-assembled monolayer material on the passivation layer following forming the plurality of contact openings in the passivation layer at portions on and surrounding one or more of the plurality of contact openings, and wherein the selective plating of the contact metal deposits the contact metal on the self-assembled monolayer and in the plurality of contact openings.

2. The method according to claim 1, wherein the plurality of contact openings are formed by laser ablation of the passivation layer.

3. The method according to claim 1, wherein the plurality of contact openings are formed by chemical etching.

4. The method according to claim 1, wherein the contact metal comprises one or more of nickel, cobalt, titanium, tantanium, tungsten, molybdenum, and palladium.

5. The method according to claim 1, wherein the at least one metal containing layer comprises a paste containing a silver or silver alloy.

6. The method according to claim 5, wherein the paste further comprises a glass frit and is substantially free to completely free of lead or lead oxide.

7. The method according to claim 1, wherein the method further comprises forming a buffer layer over the deposited contact metal prior to depositing the at least one metal containing layer.

8. The method according to claim 1, wherein the selective plating comprises electroless plating or light induced plating.

9. The method according to claim 1, wherein the depositing at least one metal containing layer over the deposited contact metal comprises screen printing, extrusion, pad printing, jet printing or dispensing a metal containing paste over the deposited contact metal layer.

10. The method according to claim 1, wherein the depositing at least one metal containing layer over the deposited contact metal comprises electroless plating, electroplating, or light induced plating one or more metal containing layers over the deposited contact metal layer.

11. The method according to claim 1, wherein the firing is conducted at about 200° C. to about 1000° C.

12. The method according to claim 1, wherein the method further comprises light activating portions of the surface of the passivation layer surrounding one or more of the plurality of contact openings, wherein the selective plating of the contact metal into the plurality of contact openings also deposits the contact metal onto the light activated portions of the passivation layer.

13. The method according to claim 1, wherein the method further comprises depositing a light sensitive seed layer on the passivation layer prior to forming the plurality of contact openings in the passivation layer, and light activating the seed layer in portions on and surrounding one or more of the plurality of contact openings, wherein the selective plating of the contact metal deposits the contact metal at light activated portions of the seed layer and in the plurality of contact openings.

14. The method according to claim 1, wherein the self-assembled monolayer is deposited by jet printing the self-assembled monolayer material onto the passivation layer surface.

15. The method according to claim 1, wherein the method further comprises immersing the deposited self-assembled monolayer in a catalyst solution prior to the selective plating.

16. The method according to claim 1, wherein the process further comprises depositing a further metal containing material on the deposited metal containing material, the further metal containing material having a conductivity greater than a conductivity of the deposited metal containing material, and wherein the firing fires the deposited contact metal, the deposited metal containing material, and the further deposited metal containing material.

17. The method according to claim 1, wherein the semiconductor substrate comprises a silicon wafer and the passivation layer comprises silicon nitride.

18. The method according to claim 12, wherein the light activating comprises application of a laser to the passivation layer surface, wherein the light activating laser has an energy density to activate the surface but not to destroy the passivation layer.

19. The method according to claim 18, wherein the plurality of contact openings are formed by laser ablation of the passivation layer, and wherein the light activating laser and laser ablation laser are aligned, with the laser ablation laser being in a middle of the light activating laser.

20. The method according to claim 13, wherein the light activating comprises application of a laser to the seed layer, wherein the light activating laser decomposes the seed layer at exposed portions, and wherein the method further comprises washing away unexposed portions of the seed layer.

21. The method according to claim 13, wherein the seed layer comprises an organometallic material.

22. The method according to claim 13, wherein the seed layer comprises a photographic emulsion.

23. The method according to claim 20, wherein the plurality of contact openings are formed by laser ablation of the passivation layer, and wherein the light activating laser and laser ablation laser are aligned, with the laser ablation laser being in a middle of the light activating laser.

24. A method for forming a photovoltaic cell electrode structure, wherein the photovoltaic cell comprises a semiconductor substrate having a passivation layer thereon, the method comprising:
  providing a plurality of contact openings through the passivation layer to the semiconductor substrate;
  selectively plating a contact metal into the plurality of contact openings to deposit the contact metal;
  depositing at least one metal containing layer over the deposited contact metal to form metal gridlines; and
  firing the deposited contact metal and the deposited metal containing material, wherein the method further comprises one of:
  (a) light activating portions of the surface of the passivation layer surrounding one or more of the plurality of contact openings, wherein the selective plating of the contact metal into the plurality of contact openings also deposits the contact metal onto the light activated portions of the passivation layer,
  (b) depositing a light sensitive seed layer on the passivation layer prior to forming the plurality of contact openings in the passivation layer, and light activating the seed layer in portions on and surrounding one or more of the plurality of contact openings, wherein the selective plating of the contact metal deposits the contact metal at light activated portions of the seed layer and in the plurality of contact openings, or
  (c) depositing a self-assembled monolayer material on the passivation layer following forming the plurality of contact openings in the passivation layer at portions on and surrounding one or more of the plurality of contact openings, and wherein the selective plating of the contact metal deposits the contact metal on the self-assembled monolayer and in the plurality of contact openings.

* * * * *